(12) United States Patent
Lee et al.

(10) Patent No.: US 8,247,274 B2
(45) Date of Patent: Aug. 21, 2012

(54) ORGANIC LIGHT-EMITTING DISPLAY APPARATUS AND METHOD OF MANUFACTURING THE SAME

(75) Inventors: Kyung-Jun Lee, Yongin (KR);
Jeong-Moon Kim, Yongin (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 0 days.

(21) Appl. No.: 12/790,640

(22) Filed: May 28, 2010

(65) Prior Publication Data

US 2011/0121350 A1 May 26, 2011

(30) Foreign Application Priority Data

Nov. 23, 2009 (KR) ........................ 10-2009-0113353

(51) Int. Cl.
*H01L 21/00* (2006.01)
(52) U.S. Cl. ....................................................... 438/149
(58) Field of Classification Search .................... 438/149
See application file for complete search history.

(56) References Cited

U.S. PATENT DOCUMENTS

| 7,671,959 | B2 * | 3/2010 | Koo et al. | 349/153 |
| 7,799,620 | B2 * | 9/2010 | Honda | 438/149 |
| 2003/0143914 | A1 * | 7/2003 | Yoon | 445/24 |
| 2006/0119268 | A1 * | 6/2006 | Lee | 313/582 |
| 2008/0110561 | A1 | 5/2008 | Lee et al. | |
| 2009/0009046 | A1 | 1/2009 | Oh et al. | |
| 2009/0009865 | A1 * | 1/2009 | Nishida et al. | 359/486 |
| 2009/0029623 | A1 | 1/2009 | Son et al. | |
| 2009/0108271 | A1 * | 4/2009 | Chou et al. | 257/88 |

FOREIGN PATENT DOCUMENTS

| KR | 10-2008-0042321 A | 5/2008 |
| KR | 10-2008-0086038 A | 9/2008 |
| KR | 10-2009-0000314 A | 1/2009 |
| KR | 10-2009-0011656 A | 2/2009 |

OTHER PUBLICATIONS

Korean Office Action issued by Korean Patent Office on Mar. 26, 2011. Corresponding to Korean Application No. 10-2009-0113353, and "Request for Entry of the Accompanying Office Action" attached herewith.
Registration Determination Certificate issued by KIPO on Oct. 31, 2011, corresponding to Korean Patent Application No. 10-2009-0113353 and Request for Entry attached herewith.

* cited by examiner

*Primary Examiner* — Charles Garber
*Assistant Examiner* — Andre' C Stevenson
(74) *Attorney, Agent, or Firm* — Robert E. Bushnell, Esq.

(57) ABSTRACT

A method of manufacturing an organic light-emitting display apparatus contemplates preparing a first substrate, preparing a second substrate, forming a first sealant and a second sealant on the second substrate, the first sealant having a height different from a height of the second sealant, injecting a filling material into a space surrounded by the first sealant and the second sealant, adhering the first substrate to the second substrate, and radiating an energy beam onto at least one of the first sealant and the second sealant.

20 Claims, 6 Drawing Sheets

ORGANIC LIGHT-EMITTING DISPLAY APPARATUS AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on the 23$^{rd}$ of Nov. 2009 and there duly assigned Serial No. 10-2009-0113353.

BACKGROUND OF THE INVENTION

1. Field of the Invention

The present invention relates to an organic light-emitting display apparatus and a method of manufacturing the same and, more particularly, to an organic light-emitting display apparatus capable of preventing deterioration of an organic light-emitting diode (OLED) and a method of manufacturing the organic light-emitting display apparatus.

2. Description of the Related Art

An organic light-emitting display apparatus is a flat panel display apparatus.

SUMMARY OF THE INVENTION

One aspect of this disclosure provides an improved organic light-emitting display apparatus and an improved method of manufacturing the organic light-emitting display apparatus.

Another aspect of this disclosure provides an organic light-emitting display apparatus with improved strength and that prevents an organic light-emitting diode (OLED) from deteriorating, and a method of manufacturing the organic light-emitting display apparatus.

According to an aspect of the present invention, a method of manufacturing an organic light-emitting display apparatus contemplates preparing a first substrate, preparing a second substrate, forming a first sealant and a second sealant on the second substrate, the first sealant having a height different from a height of the second sealant, injecting a filling material into a space surrounded by the first sealant and the second sealant, adhering the first substrate to the second substrate, and radiating an energy beam onto at least one of the first sealant and the second sealant.

The first sealant may be disposed at an inner side of the organic light-emitting display apparatus and contact the filling material, and the second sealant may be disposed at an outer side of the organic light-emitting display apparatus and may not contact the filling material.

The energy beam may be radiated only onto the second sealant.

Alternatively, another energy beam may be radiated onto the first sealant. In this case, the energy beam radiated onto the second sealant may have an intensity different than an intensity of the energy beam radiated onto the first sealant. More specifically, the energy beam radiated onto the second sealant has a lower intensity than the energy beam radiated onto the first sealant.

The first sealant and the second sealant may be disposed to surround a display unit which includes an organic light-emitting diode (OLED).

The first sealant and the second sealant may contact each other.

The first sealant and the second sealant may be formed by screen printing.

The first sealant and the second sealant may be printed onto the second substrate using a mask plate for screen printing. The mask plate may include a first pattern unit for forming the first sealant and a second pattern unit for forming the second sealant. Each one of the first pattern unit and the second unit may include a plurality of pattern holes. The pattern holes in the first pattern unit may have a size different than a size of the pattern holes in the second pattern unit.

The first sealant and the second sealant may be simultaneously printed.

The first sealant and the second sealant may be frits.

A height of the second sealant may be greater than a height of the first sealant.

A first width of a first area of contact between the first sealant and the second substrate and a second width of a second area of contact between the second sealant and the second substrate may be different from each other.

Or, alternatively, the first width and the second width may be the same

A filling material having an elasticity or a viscosity may be injected into a space formed by the first sealant and the second sealant.

When the first substrate and the second substrate are adhered to each other, a laser is radiated along a path in which the first sealant and the second sealant are formed.

When the first substrate and the second substrate are adhered to each other, after the energy radiation, the heights of the first sealant and the second sealant may become the same.

A display unit including an OLED may be formed on in one substrate from among the first substrate and the second substrate, and the first sealant and the second sealant may surround the display unit.

According to another aspect of the present invention, an organic light-emitting display apparatus may be constructed with a first substrate including a display unit having an OLED, a second substrate facing and adhered to the first substrate, a first sealant and a second sealant surrounding the display unit and adhering the first substrate to the second substrate, and a filling material included inside a space surrounded by the first sealant and the second sealant. One of the first sealant and the second sealant that contacts the filling material may have a hardening degree lower than that of the sealant that does not contact the filling material.

The sealant contacting the filling material may be an unhardened sealant.

The first sealant and the second sealant may contact each other.

The first sealant and the second sealant may be frits.

Heights of the first sealant and the second sealant may be the same.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

In a flat panel display apparatus, an organic light-emitting layer is disposed between electrodes opposite to each other. Electrons injected from one electrode are coupled with holes injected from the other electrode, and luminescent molecules of the organic light-emitting layer are excited through the coupling. When the excited luminescent molecules return to a ground state, energy is emitted, and the energy is converted into light.

Organic light-emitting display apparatuses have advantages, such as high visibility, a light and compact size, and low-voltage driving, and thus, have attracted much attention as display apparatuses of the next-generation.

Organic light-emitting display apparatuses may, however, deteriorate due to oxygen and water that permeates from the outside. To solve this problem, recently, organic light-emitting diodes (OLEDs) are sealed using an inorganic sealant, such as a frit. In such a frit-sealing structure, a gap between a first substrate and a second sealing substrate is completely sealed by hardening a melted fit, and thus it is not necessary to use an absorbent material, thereby further effectively protecting OLEDs.

When an external impact is applied to the frit-sealing structure, however, a stress concentration occurs in a contact surface between a frit and a substrate due to the fragility of the frit material. Thus, a crack is generated in the contact surface and propagates throughout the entire substrate.

Now, an exemplary embodiment according to the present invention will be described in detail with reference to the accompanying drawings.

Figure 1:
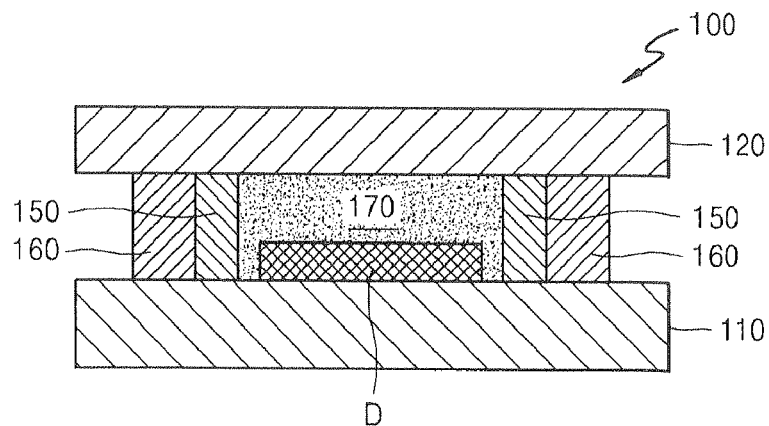
FIG. 1 is a schematic cross-sectional view of a part of an organic light-emitting display apparatus constructed as an embodiment according to the principles of the present invention.
Figure 2:
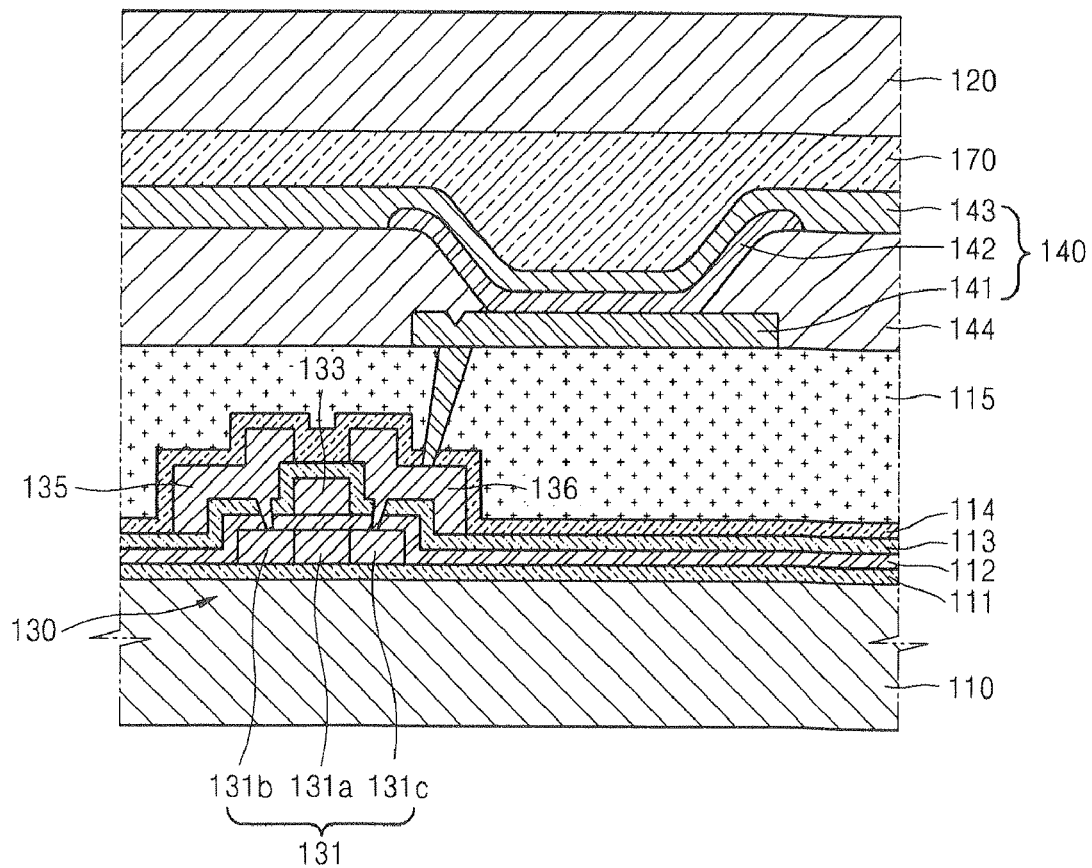
FIG. 2 is a detailed cross-sectional view of a display unit of the organic light-emitting display apparatus of FIG. 1 constructed as an embodiment according to the principles of the present invention.

FIG. 1 is a schematic cross-sectional view of a part of an organic light-emitting display apparatus 100 constructed as an embodiment according to the principles of the present invention, and FIG. 2 is a detailed cross-sectional view of a display unit D of the organic light-emitting display apparatus 100 of FIG. 1, according to an embodiment of the present invention.

Referring to FIGS. 1 and 2, organic light-emitting display apparatus 100 constructed as the present embodiment of the present invention includes a first substrate 110, a second substrate 120, a first sealant 150, a second sealant 160, and a filling material 170.

Display unit D is formed on first substrate 110 facing second substrate 120. First sealant 150 and second sealant 160 contact each other and surround display unit D.

Display unit D includes a plurality of organic light-emitting diodes (OLEDs) 140 and a plurality of thin-film transistors (TFTs) 130, each connected to a respective OLED 140. An OLED may be classified into a passive matrix (PM) type and an active matrix (AM) type according to whether an OLED is controlled by a TFT or not. The organic light-emitting display apparatus according to the current embodiment may be both the PM and AM types. Hereinafter, an AM type organic light-emitting display apparatus will be described.

First substrate 110 and second substrate 120 may be transparent glass substrates formed of $SiO_2$. The present invention is, however, not limited thereto. First substrate 110 and second substrate 120 may be various substrates formed of various materials, for example, plastic.

A buffer layer 111 may be formed on first substrate 110 so as to flatten first substrate 110 and to prevent impurities from entering first substrate 110. Buffer layer 111 may be formed of $SiO_2$ and/or SiNx.

An active layer 131 formed of a semiconductor material may be formed on buffer layer 111. A gate insulating layer 112 is formed on buffer layer 111. Active layer 131 may be formed of an inorganic semiconductor material, such as amorphous silicon or poly silicon, or an organic semiconductor material. Active layer 131 includes a source region 131b, a drain region 131c, and a channel region 131a that is formed between source region 131b and drain region 131c.

A gate electrode 133 is formed on gate insulating layer 112. An insulating interlayer 113 is formed to cover gate electrode 133 and gate insulating layer 112. A source electrode 135 and a drain electrode 136 are formed on insulating interlayer 113. A passivation layer 114 and a planarization layer 115 are sequentially formed to cover insulating interlayer 113.

Gate insulating layer 112, insulating interlayer 113, passivation layer 114, and planarization layer 115 may be formed of an insulation material, and may have a single-layer structure or a multi-layer structure including an inorganic material, an organic material, or a combination thereof. The stack structure of TFT 130 is only an example, and TFTs having various structures may also be used.

A first electrode 141, which is an anode of OLED 140, may be formed on planarization layer 115, and a pixel-defining layer 144 formed of an insulation material may be formed to cover first electrode 141. A predetermined opening is formed in pixel-defining layer 144, and then an organic light-emitting layer 142 of OLED 140 is formed in a region defined by the opening. A second electrode 143, which is a cathode of OLED 140, is formed to cover all of the pixels. The polarities of first electrode 141 and second electrode 143 may be reversed.

First electrode 141 may be a transparent electrode or a reflective electrode. When first electrode 141 is a transparent electrode, first electrode 141 may be formed of ITO, IZO, is ZnO or $In_2O_3$. When first electrode 141 is a reflective electrode, first electrode 141 may include a reflective layer formed of Ag, Mg, Al, Pt, Pd, Au, Ni, Nd, Ir, Cr or a compound thereof and a transparent layer formed of ITO, IZO, ZnO or $In_2O_3$.

Second electrode 143 may be a transparent electrode or a reflective electrode. When second electrode 143 is a transparent electrode, second electrode 143 may include a layer formed by depositing Li, Ca, LiF/Ca, LiF/Al, Al, Mg or a compound thereof so as to face organic light-emitting layer 142, and an auxiliary electrode or a bus electrode line formed of a transparent conductive material such as of ITO, IZO, ZnO or $In_2O_3$. When second electrode 143 is a reflective electrode, second electrode 143 may be formed of Li, Ca, LiF/Ca, LiF/Al, Al, Mg and a compound thereof.

Organic light-emitting layer 142 formed between first electrode 141 and second electrode 143 may be formed of a low-molecular weight organic material or a polymer organic material. When organic light-emitting layer 142 is formed of the low-molecular weight organic material, a hole injection layer (HIL) (not shown), a hole transport layer (HTL) (not shown), an electron transport layer (ETL) (not shown), an electron injection layer (EIL) (not shown), etc. may be stacked in a single-layer structure or a multi-layer structure by interposing organic light-emitting layer 142 therebetween. Organic light-emitting layer 142 may be formed of various organic materials, for example, copper phthalocyanine (CuPc), N,N'-di(naphthalene-1-yl)-N,N'-diphenyl-benzidine (NPB), tris(8-hydroxyquinoline) aluminum (Alq3), or the like. Organic light-emitting layer 142 may be formed of the low-molecular weight organic material using a vacuum evaporation method using masks.

When organic light-emitting layer 142 is formed of the polymer organic material, the HTL may be further included at a side close to the anode. In this instance, the HTL may be formed of polyethylenedioxythiophene (PEDOT), and organic light-emitting layer 142 may be formed of a poly (phenylene vinylene) (PPV)-based polymer organic material or a polyfluorene-based polymer organic material.

Although not shown in FIG. 2, a spacer (not shown) may be further included on pixel-defining layer 144 to maintain a gap between OLED 140 and second substrate 120.

First sealant 150 and second sealant 160 are formed on a surface of first substrate 110 facing second substrate 120 so as to surround display unit D. That is, first sealant 150 and second sealant 160 surround a space formed between first substrate 110 and second substrate 120, and display unit D is disposed in the space. As shown in FIG. 1, first sealant 150 is disposed in an inner side close to display unit D, and second sealant 160 is disposed in an outer side far from display unit D. An outer circumference of first sealant 150 is surrounded by second sealant 160. First sealant 150 and second sealant 160 are adhered to each other through first substrate 110 and second substrate 120, and are used to prevent oxygen and water from entering OLED 140 from the outside.

First sealant 150 and second sealant 160 may be formed of an organic material such as epoxy, but may be formed of an inorganic material, such as fit, that does not need to use an additional absorbent material. The fit, for example, a glass material in paste form, is deposited on first substrate 110 and/or second substrate 120 and is melted by using a laser or infrared rays, and then the glass material is hardened, thereby sealing first substrate 110 and second substrate 120.

In this instance, hardening degrees of first sealant 150 and second sealant 160 are different from each other. In detail, the hardening degree of first sealant 150 close to display unit D is less than that of second sealant 160 far from display unit D. After first sealant 150 and second sealant 160 are hardened, the heights of the hardened first sealant 150 and second sealant 160 are the same, as will now be described in detail.

In a frit-sealing structure, when an external impact is applied to the frit-sealing structure, a stress concentration occurs in a contact surface between first and second sealants 150 and 160 and first substrate 110 and/or second substrate 120 due to the fragility of the frit material. Thus, a crack is generated in the contact surface and propagates throughout an entire substrate. To prevent the crack generation, filling material 170 is formed in the space surrounded by first and second sealants 150 and 160. The space is formed when first substrate 110 and second substrate 120 are adhered to each other. As shown in FIG. 1, filling material 170 only contacts first sealant 150, and filling material 170 does not contact second sealant 160.

Filling material 170 is formed of a material having a predetermined elasticity and viscosity. Filling material 170 is filled inside organic light-emitting display apparatus 100, so that organic light-emitting display apparatus 100 is prevented from being damaged by an external impact. When filling material 170 contacts a sealant, however, a portion of filling material 170 disposed around the sealant may deteriorate at a high temperature due to energy sources, for example, a laser that is used to harden first and second sealants 150 and 160. The deterioration of tilling material 170 may strain OLED 140.

Accordingly, in organic light-emitting display apparatus 100 constructed as the current embodiment according to the principles of the present invention, the hardening degree of first sealant 150 that contacts filling material 170 and the hardening degree of second sealant 160 that does not contact filling material 170 are different from each other. Preferably, the hardening degree of first sealant 150 that contacts filling material 170 may be lower than that of second sealant 160 that does not contact filling material 170. More preferably, first sealant 150 that contacts filling material 170 is not hardened, so that filling material 170 that contacts first sealant 150 is prevented from deteriorating at a high temperature.

Hereinafter, a method of manufacturing an organic light-emitting display apparatus, according to an embodiment of the present invention, will be described in detail with reference to FIGS. 3 through 8.

FIGS. 3 through 8 are schematic cross-sectional views of organic light-emitting display apparatus 100 manufactured according to a method of manufacturing organic light-emitting display apparatus 100 of FIG. 1, as an embodiment according to the principles of the present invention.

Figure 3:
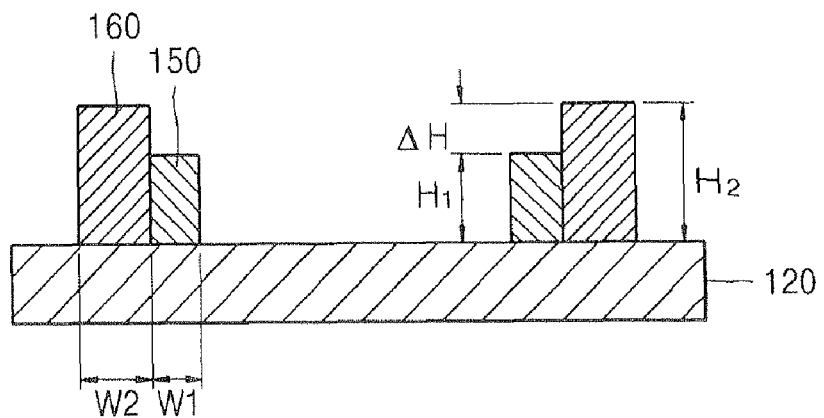
FIG. 3 is a schematic cross-sectional view of a second substrate of an organic light-emitting display apparatus manufactured according to a method as an embodiment of the principles of the present invention.

FIG. 3 is a schematic cross-sectional view of a second substrate of organic light-emitting display apparatus 100 manufactured according to a method as an embodiment of the principles of the present invention. Referring to FIG. 3, second substrate 120 is prepared, and first sealant 150 and second sealant 160 are formed on second substrate 120. First sealant 150 and second sealant 160 have different heights.

First sealant 150 is formed in an inner side of organic light-emitting display apparatus 100, that is, in a portion close to the center of second substrate 120. Second sealant 160 is formed in an outer side of organic light-emitting display apparatus 100, that is, in a portion far from the center of second substrate 120. First sealant 150 and second sealant 160 contact each other.

A height H1 of first sealant 150 is less that a height H2 of second sealant 160. The inequality of height H1 and height H2 can be expressed in the following equation, $$H1 < H2 \quad (1)$$

In the current embodiment, a width W1 of a first contact area between first sealant 150 and second substrate 120 is less than a width W2 of a second contact area between second sealant 160 and second substrate 120; however the present invention is not limited thereto, and widths W1 and W2 may be the same, or width W1 may be greater than width W2.

Both first sealant 150 and second sealant 160 may be formed of a frit, that is, an inorganic material and the frit may be formed by screen printing.

Figure 4:
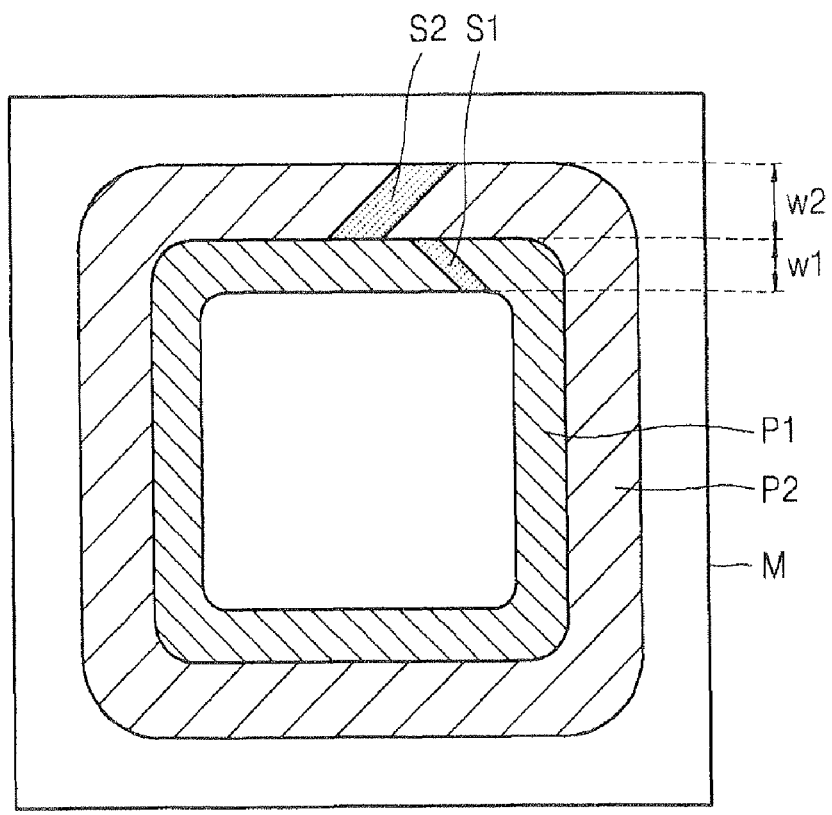
FIG. 4 is a schematic plane view illustrating a mask plate for forming first and second sealants on the second substrate of FIG. 3 according to a method as an embodiment of the principles of the present invention.

FIG. 4 is a schematic plane view illustrating a mask plate M for screen printing so as to form first and second sealants 150 and 160 on second substrate 120, according to a method as an embodiment of the principles of the present invention.

Referring to FIG. 4, mask plate M for screen printing includes a first pattern unit P1 and a second pattern unit P2 that directly surrounds first pattern unit P1.

First pattern unit P1 and second pattern unit P2 have different widths W1 and W2. First pattern unit P1 includes a plurality of pattern holes S1, and second pattern unit P2 includes a plurality of pattern holes S2. Pattern holes S1 have a size different from that of pattern holes S2. In FIG. 4, first pattern unit P1 and second pattern unit P2 are patterned in a mesh pattern. However, the present invention is not limited thereto, and thus, first pattern unit P1 and second pattern unit P2 may be patterned in various patterns.

When a bottom surface of mask plate M contacts second substrate 120, a squeezer (not shown) for squeezing a frit in a past form is shifted on a top surface of mask plate M. As a result, the frit in the paste form is printed on second substrate 120. In this case, first sealant 150 and second sealant 160 are simultaneously formed.

In this instance, heights of first and second sealants 150 and 160 formed on second substrate 120 are different according to widths W1 and W2 and pattern holes S1 and S2 of mask plate M. That is, second sealant 160 that is printed along second pattern unit P2 having a wider pattern width and size is formed to be higher than first sealant 150 that is printed along first pattern unit P1. The heights of first sealant 150 and second sealant 160 may be controlled by changing the shapes and sizes of first and second pattern holes S1 and S2 of first and second pattern units P1 and P2 formed on mask plate M.

Figure 5:
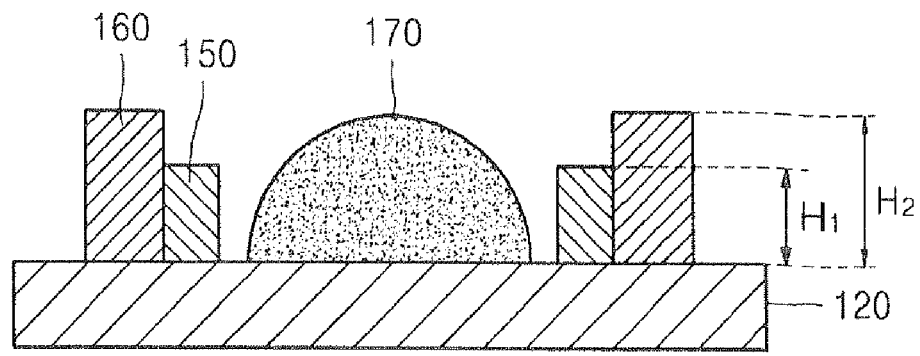
FIG. 5 is a schematic cross-sectional view of a filling material injected on the second substrate of FIG. 3 according to a method as an embodiment of the principles of the present invention.

FIG. 5 is a schematic cross-sectional view of a filling material injected on second substrate 120 according to a method as an embodiment of the principles of the present invention. Referring to FIG. 5, a filling material 170 is injected onto second substrate 120 on which first and second sealants 150 and 160 are formed. Filling material 170 having predetermined elasticity and viscosity is filled inside the organic light-emitting display apparatus 100, so that organic light-emitting display apparatus 100 is prevented from being damaged by an external impact.

Figure 6:
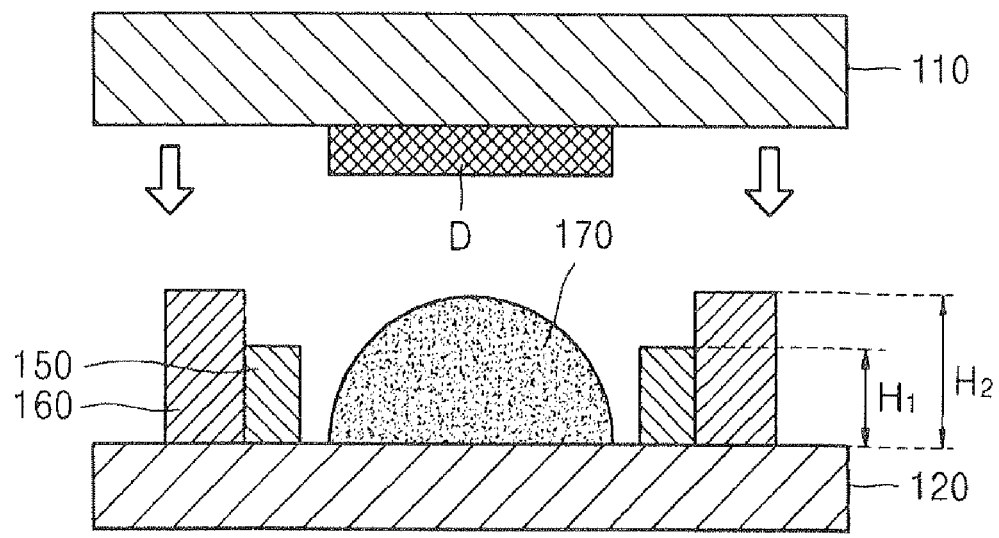
FIG. 6 is a schematic cross-sectional view of a first substrate coupling to the second substrate of FIG. 5 according to a method as an embodiment of the principles of the present invention.

FIG. 6 is a schematic cross-sectional view of first substrate 110 coupling to second substrate 120 according to a method as an embodiment of the principles of the present invention. Referring to FIG. 6, first substrate 110 including display unit D including an OLED 140 is aligned with and adhered to second substrate 120. In this instance, first substrate 110 and second substrate 120 may be adhered to each other through vacuum adhesion. In the current embodiment, display unit D is formed on first substrate 110, and first and second sealants 150 and 160 are formed on second substrate 120. The present invention is not, however, limited thereto. For example, first and second sealants 150 and 160 may be directly formed on first substrate 110 including display unit D.

Figure 7:
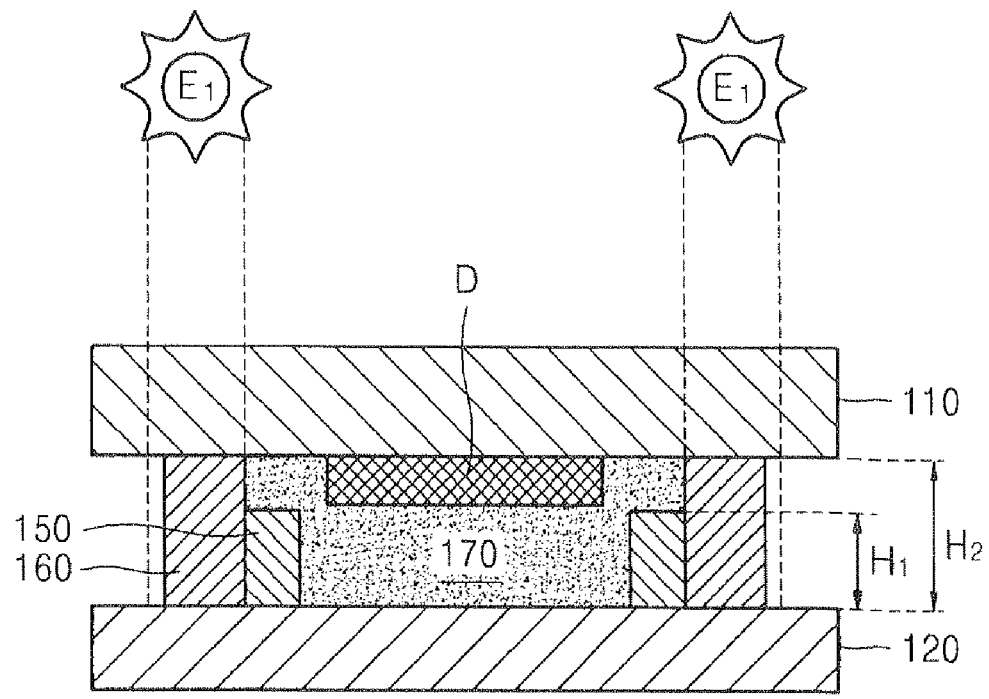
FIG. 7 is a schematic cross-sectional view of the organic light-emitting display apparatus of FIG. 6 in a hardening process according to a method as an embodiment of the principles of the present invention.

FIG. 7 is a schematic cross-sectional view of organic light-emitting display apparatus 100 in a hardening process according to a method as an embodiment of the principles of the present invention. Referring to FIG. 7, after first substrate 110 and second substrate 120 are adhered to each other, a laser beam that generates energy E1 having a predetermined intensity is radiated on second sealant 160 to harden second sealant 160 that does not contact filling material 170 and not harden first sealant 150 that contacts filling material 170. That is, the laser beam that generates energy E1 is radiated along a path in which second sealant 160 is formed. In this instance, a hardening condition, such as a hardening time, is determined such that height H2 of second sealant 160 and height H1 of first sealant 150 may be the same after the hardening process.

Figure 8:
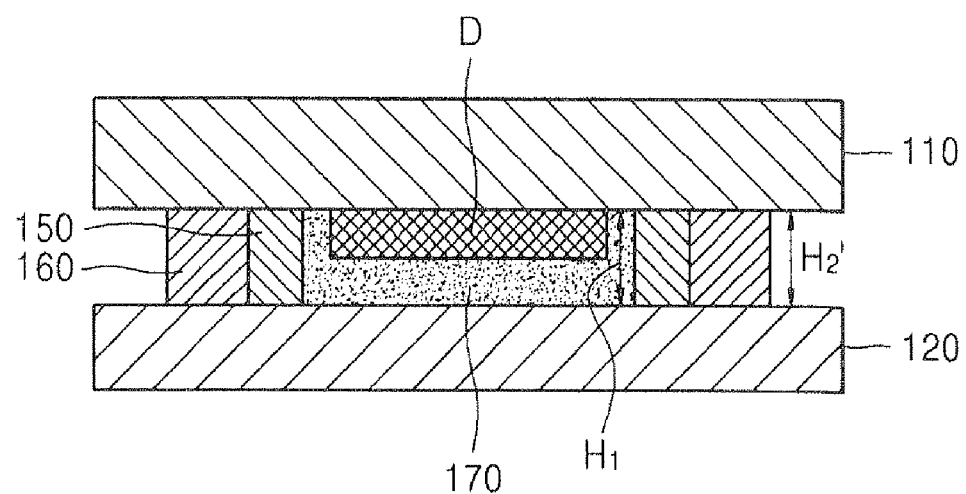
FIG. 8 is a schematic cross-sectional view of the organic light-emitting display apparatus of FIG. 7 after the hardening process according to a method as an embodiment of the principles of the present invention.

FIG. 8 is a schematic cross-sectional view of organic light-emitting display apparatus 100 after the hardening process according to a method as an embodiment of the principles of the present invention. Referring to FIG. 8, after the aforementioned hardening process, second sealant 160 contracts to have a height H2' the same as height H1 of first sealant 150. The relationship between height H1 and height H2 can be expressed in the following equation, $$H1 = H2 \quad (2)$$

Also, since a laser beam is not radiated on first sealant 150 that contacts filling material 170, filling material 170 may be prevented from deteriorating due to a high temperature laser.

Figure 9:
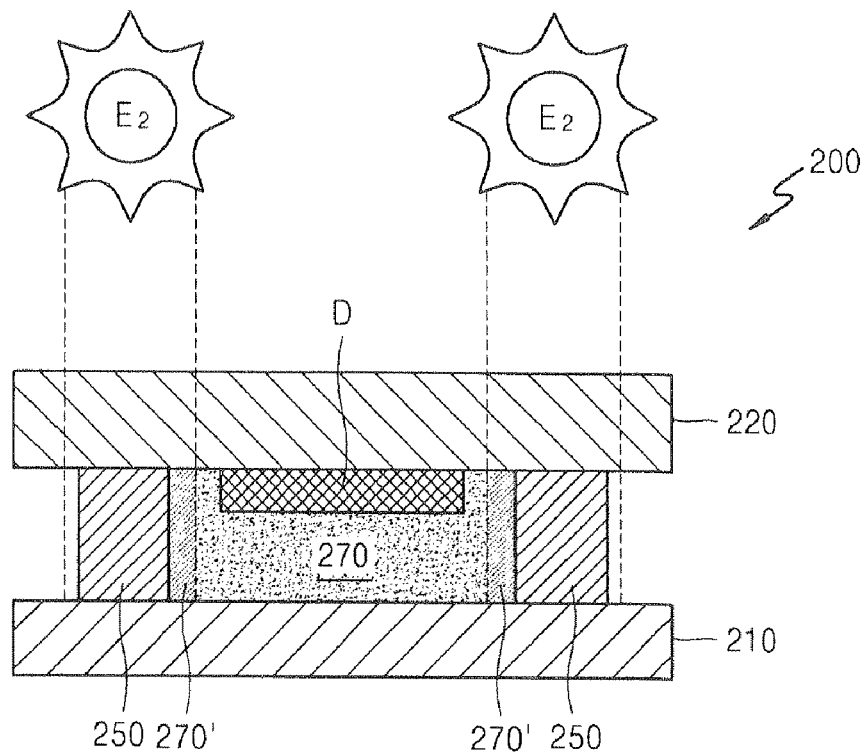
FIG. 9 is a schematic cross-sectional view of an organic light-emitting display apparatus in a process of hardening a sealant according to a comparative example.

FIG. 9 is a schematic cross-sectional view of an organic light-emitting display apparatus in a process of hardening a sealant according to a comparative example. Referring to FIG. 9, organic light-emitting display apparatus 200 according to the comparative example includes a first substrate 210, a second substrate 220, a sealant 250, and a display unit D. A single sealant 250 is formed between first substrate 210 and second substrate 220 and surrounds display unit D. A filling material 270 is filled inside a space surrounded by sealant 250. When a laser beam that generates energy E2 having a predetermined intensity is radiated on sealant 250 to harden sealant 250, a portion 270' of filling material 270 that contacts sealant 250 may undesirably deteriorate due to a high temperature laser beam. The deterioration of filling material 270' strains an OLED, thereby deteriorating the performance of organic light-emitting display apparatus 200.

Figure 10A:
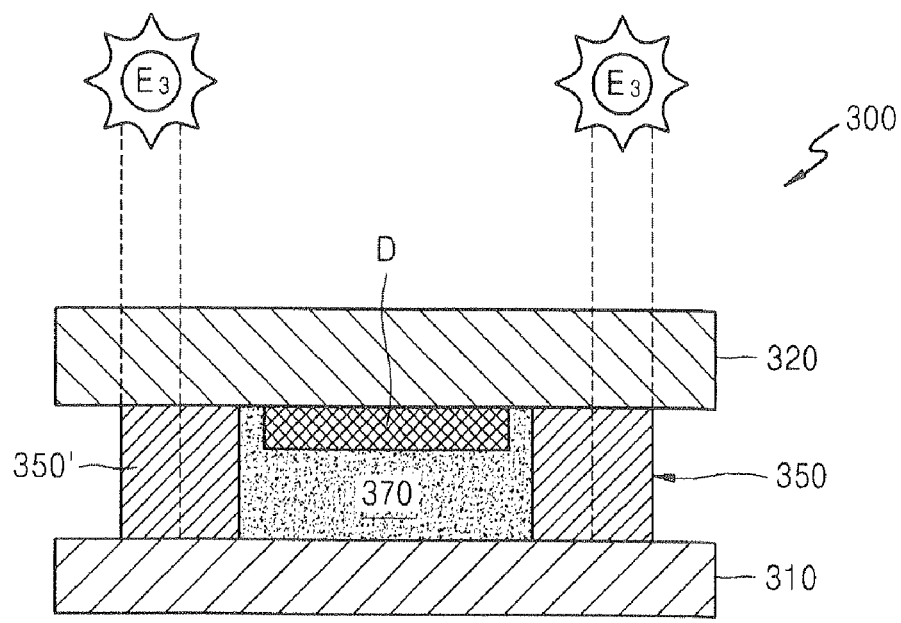
FIG. 10A is a schematic cross-sectional view of an organic light-emitting display apparatus in a process of hardening a sealant according to another comparative example.

FIG. 10A is a schematic cross-sectional view of an organic light-emitting display apparatus in a process of hardening a sealant according to another comparative example. Referring to FIG. 10A, an organic light-emitting display apparatus 300 according to the comparative example includes a first substrate 310, a second substrate 320, a sealant 350, and a display unit D. Sealant 350 is formed between first substrate 310 and second substrate 320 and surrounds display unit D. A filling material 370 is filled inside sealant 350. When entire sealant 350 is hardened, filling material 370 adjacent to sealant 350 may deteriorate. Accordingly, in the current comparative example, a laser beam that generates energy E3 having a predetermined intensity is radiated only on an outer portion 350' of sealant 350 that does not contact filling material 370 due to the interposition of the inner volume of sealant 350 between outer portion 350' and filling material 370.

Figure 10B:
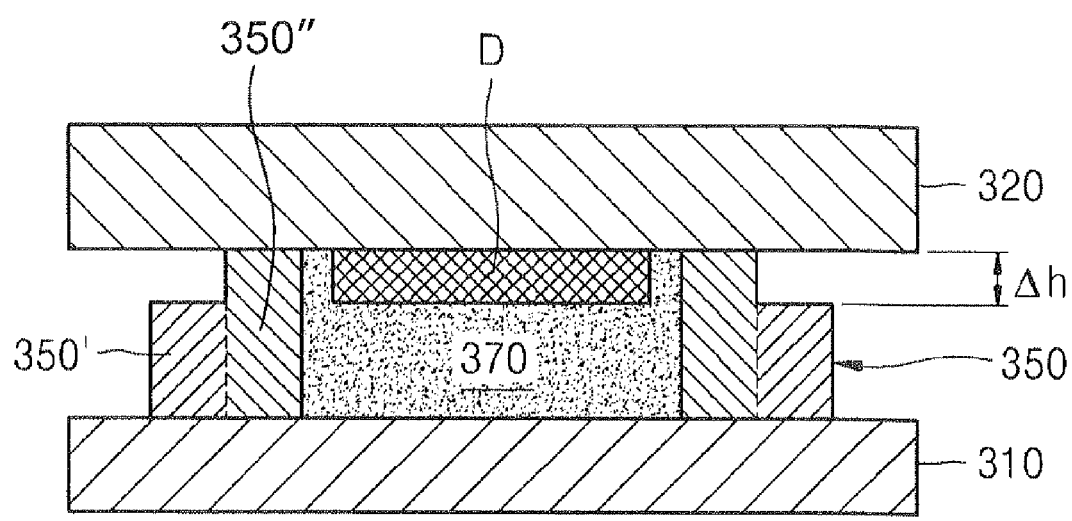
FIG. 10B is a schematic cross-sectional view of the organic light-emitting display apparatus of FIG. 10A after the process of hardening the sealant according to the other comparative example.

FIG. 10B is a schematic cross-sectional view of the organic light-emitting display apparatus of FIG. 10A after the process of hardening the sealant according to the other comparative example. Referring to FIG. 10B, outer portion 350' of sealant 350 on which laser beam E3 is radiated contracts, thereby resulting in a height difference Δh between outer portion 350' and inner portion 350″ of sealant 350 that contacts filling material 370. When the height of sealant 350 is not constant, a gap may exist between sealant 350 and first and second substrates 310 and 320. Thus, oxygen and water may enter an OLED through the gap from the outside, thereby resulting in low performance of the OLED.

Accordingly, when organic light-emitting display apparatuses 200 and 300 according to the aforementioned comparative examples are compared with organic light-emitting display apparatus 100 according to the current embodiment, the heights of first sealant 150 and second sealant 160 are different from each other, and of first and second sealants 150 and 160, only second sealant 160 that does not contact filling material 170 is hardened using a laser beam, so that filling material 170 may be prevented from deteriorating due to a high temperature laser.

Meanwhile, in the embodiments described with respect to FIGS. 1-8, to harden the sealant, a laser beam is radiated only on second sealant 160 and is not radiated on first sealant 150. But, this is just an example, and the present invention is not limited thereto. For example, if a hardening process applies energy that does not strain filling material 170, the hardening process may be performed by applying a predetermined energy to first sealant 150 that contacts filling material 170. In this instance, in consideration of the amount of contraction of first sealant 150, a hardening condition, such as a hardening time, should be controlled so that heights of first sealant 150 and second sealant 160 after the hardening become the same.

As described above, in a method of manufacturing an organic light-emitting display apparatus, according to an embodiment of the present invention, a sealant which contacts a filling material is not hardened or is hardened with a low energy, and thus deterioration of the filling material due to a high temperature hardening is prevented, thereby preventing an OLED from being strained.

According to embodiments of the present invention, an organic light-emitting display apparatus prevents hardening of a filling material that contacts a frit, and thus the intensity of the organic light-emitting display apparatus is increased, thereby preventing an OLED from deteriorating.

While the present invention has been particularly shown and described with reference to exemplary embodiments thereof, it will be understood by one of ordinary skill in the art that various changes in form and detail may be made therein without departing from the spirit and scope of the present invention as defined by the following claims.

What is claimed is:

1. A method of manufacturing an organic light-emitting display apparatus, the method comprising the steps of:
preparing a first substrate;
preparing a second substrate;
forming a first sealant and a second sealant on the second substrate, the first sealant having a height different from a height of the second sealant;
injecting a filling material into a space surrounded by the first sealant and the second sealant;
adhering the first substrate to the second substrate; and
radiating an energy beam onto at least one of the first sealant and the second sealant, the first sealant separating the second sealant from the filling material injected into the space.

2. The method of claim 1, wherein the first sealant is disposed at an inner side of the organic light-emitting display apparatus and contacts the filling material, and the second sealant is disposed at an outer side of the organic light-emitting display apparatus and does not contact the filling material,
the energy beam is radiated only onto the second sealant.

3. The method of claim 1, wherein the first sealant is disposed at an inner side of the organic light-emitting display apparatus and contacts the filling material, and the second sealant is disposed at an outer side of the organic light-emitting display apparatus and does not contact the filling material,
the method further comprising radiating another energy beam onto the first sealant,
the energy beam radiated onto the second sealant having an intensity different from an intensity of the energy beam radiated onto the first sealant.

4. The method of claim 3, wherein the energy beam radiated onto the second sealant has a lower intensity than the energy beam radiated onto the first sealant.

5. The method of claim 1, wherein the first sealant and the second sealant surround a display unit comprising an organic light-emitting diode (OLED).

6. The method of claim 1, wherein the first sealant and the second sealant contact each other.

7. The method of claim 1, wherein the first sealant and the second sealant are formed by screen printing.

8. The method of claim 1, wherein the first sealant and the second sealant are frits.

9. The method of claim 1, wherein the first sealant is disposed at an inner side of the organic light-emitting display apparatus and contacts the filling material, and the second sealant is disposed at an outer side of the organic light-emitting display apparatus and does not contact the filling material,
a height of the second sealant is greater than a height of the first sealant before the energy beam is radiated.

10. The method of claim 1, wherein a first width of a first area of contact between the first sealant and the second substrate and a second width of a second area of contact between the second sealant and the second substrate are different from each other.

11. The method of claim 1, wherein a first width of a first area of contact between the first sealant and the second substrate and a second width of a second area of contact between the second sealant and the second substrate are the same.

12. The method of claim 1, wherein the filling material having an elasticity or a viscosity is injected into the space surrounded by the first sealant and the second sealant.

13. The method of claim 1, wherein when the first substrate and the second substrate are adhered to each other, a laser is radiated along a path in which the first sealant and the second sealant are formed.

14. The method of claim 1, wherein after the energy radiation, the heights of the first sealant and the second sealant become the same.

15. The method of claim 1, wherein a display unit comprising an OLED is formed on one substrate from among the first substrate and the second substrate, and the first sealant and the second sealant surround the display unit.

16. An organic light-emitting display apparatus, comprising:
a first substrate comprising a display unit having an organic light-emitting diode (OLED);
a second substrate facing and adhering to the first substrate;
a first sealant and a second sealant surrounding the display unit and adhering the first substrate to the second substrate; and
a filling material disposed inside a space surrounded by the first sealant and the second sealant;

one of the first sealant and the second sealant that contacts the filling material has a hardening degree lower than that of the sealant that does not contact the filling material.

17. The device of claim 16, wherein the sealant contacting the filling material is an unhardened sealant.

18. The device of claim 16, wherein the first sealant and the second sealant contact each other.

19. The device of claim 16, wherein the first sealant and the second sealant are frits.

20. The device of claim 18, wherein heights of the first sealant and the second sealant are the same.

* * * * *